(12) United States Patent
Roy et al.

(10) Patent No.: US 11,736,826 B2
(45) Date of Patent: Aug. 22, 2023

(54) PIXEL AND METHOD FOR CONTROLLING THE SAME

(71) Applicant: STMicroelectronics (Crolles 2) SAS, Crolles (FR)

(72) Inventors: Francois Roy, Seyssins (FR); Thomas Dalleau, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 187 days.

(21) Appl. No.: 16/912,609

(22) Filed: Jun. 25, 2020

(65) Prior Publication Data

US 2020/0412986 A1 Dec. 31, 2020

(30) Foreign Application Priority Data

Jun. 28, 2019 (FR) ...................................... 1907148

(51) Int. Cl.
| | |
|---|---|
| *H04N 25/57* | (2023.01) |
| *H01L 27/146* | (2006.01) |
| *H04N 25/76* | (2023.01) |
| *H04N 25/77* | (2023.01) |
| *H04N 25/709* | (2023.01) |

(52) U.S. Cl.
CPC ....... *H04N 25/57* (2023.01); *H01L 27/14616* (2013.01); *H04N 25/76* (2023.01); *H04N 25/77* (2023.01)

(58) Field of Classification Search
CPC ...... H04N 5/355; H04N 5/374; H04N 5/3745; H04N 5/3698; H04N 25/57; H04N 25/76; H04N 25/77; H04N 25/709; H01L 27/14616; H01L 27/14643
See application file for complete search history.

(56) References Cited

U.S. PATENT DOCUMENTS

| | | | |
|---|---|---|---|
| 4,337,817 A | 7/1982 | Komatsu et al. | |
| 6,084,259 A * | 7/2000 | Kwon | ............... H01L 27/14609 |
| | | | 257/292 |
| 6,180,969 B1* | 1/2001 | Yang | ................... H01L 27/1443 |
| | | | 257/E27.128 |
| 6,184,055 B1 | 2/2001 | Yang et al. | |
| 6,677,993 B1* | 1/2004 | Suzuki | ................... H04N 5/365 |
| | | | 348/241 |
| 7,067,792 B2 | 6/2006 | Cazaux et al. | |

(Continued)

FOREIGN PATENT DOCUMENTS

JP      2005-353994 A      12/2005

OTHER PUBLICATIONS

Furumiya et al., "High-Sensitivity and No-Crosstalk Pixel Technology for Embedded CMOS Image Sensor" (Oct. 2001), IEEE Transactions on Electron Devices, vol. 48, No. 10, pp. 2221-2227 (Year: 2001).*

(Continued)

*Primary Examiner* — Albert H Cutler
(74) *Attorney, Agent, or Firm* — Seed IP Law Group LLP

(57) ABSTRACT

A pixel includes: a detection node; a first normally on transistor connected between the detection node and a rail for applying a first potential; and a second transistor whose gate is connected to the detection node. An image sensor includes a plurality of the pixels and a control circuit configured to apply, during for a phase of initializing the detection node, the first potential to the gate of the first transistor.

17 Claims, 2 Drawing Sheets

(56) References Cited

U.S. PATENT DOCUMENTS

| | | | |
|---|---|---|---|
| 8,513,761 | B2 | 8/2013 | Roy et al. |
| 8,531,567 | B2 | 9/2013 | Roy et al. |
| 2006/0289911 | A1 | 12/2006 | Lee et al. |
| 2007/0029590 | A1 | 2/2007 | Rhodes et al. |
| 2007/0052056 | A1 | 3/2007 | Doi et al. |
| 2007/0147132 | A1* | 6/2007 | Lee .................. H04N 5/3745 365/185.23 |
| 2007/0272958 | A1 | 11/2007 | Misaki et al. |
| 2008/0083940 | A1 | 4/2008 | Ezaki et al. |
| 2008/0173963 | A1 | 7/2008 | Hsu et al. |
| 2008/0224191 | A1* | 9/2008 | Ahn .................. H01L 29/1083 257/292 |
| 2008/0290382 | A1 | 11/2008 | Hirota |
| 2009/0184317 | A1 | 7/2009 | Sanfilippo et al. |
| 2010/0019295 | A1 | 1/2010 | Henderson et al. |
| 2010/0127314 | A1 | 5/2010 | Frach |
| 2010/0133636 | A1 | 6/2010 | Richardson et al. |
| 2010/0193845 | A1 | 8/2010 | Roy et al. |
| 2010/0230579 | A1 | 9/2010 | Watanabe |
| 2012/0199882 | A1 | 8/2012 | Shin |
| 2013/0083179 | A1* | 4/2013 | Kotani ................ A61B 1/045 348/E7.085 |
| 2013/0193546 | A1 | 8/2013 | Webster et al. |
| 2013/0230956 | A1 | 9/2013 | Meiser et al. |
| 2013/0292847 | A1 | 11/2013 | Choi et al. |
| 2014/0191290 | A1* | 7/2014 | Funao .............. H01L 27/14643 257/231 |
| 2015/0021461 | A1 | 1/2015 | Nishihara et al. |
| 2016/0300827 | A1 | 10/2016 | Vendt et al. |
| 2017/0222010 | A1 | 8/2017 | Weis et al. |
| 2017/0338274 | A1* | 11/2017 | Gancarz ............. H04N 5/3745 |
| 2019/0237499 | A1 | 8/2019 | Roy |
| 2020/0312837 | A1 | 10/2020 | Kuo et al. |

OTHER PUBLICATIONS

Ancey et al., "Setting up 3D Sequential Integration for Back-Illuminated CMOS Image Sensors with Highly Miniaturized Pixels with low temperature Fully Depleted SOI transistors", 2008 IEEE International Electron Devices Meeting (Year: 2008).*

Abid, "Gated Lateral Silicon p-i-n Junction Photodiodes," doctoral thesis, University of Glasgow, School of Engineering, Glascow, United Kingdom, Jul. 2011, 215 pages.

Fontaine, "A Review of the 1.4 μm Pixel Generation," Technology Analysis Group Chipworks Inc., Jan. 2011, 4 pages.

Fontaine, "Innovative Technology Elements for Large and Small Pixel CIS Devices" Technology Analysis Group, Chipworks, Inc., 2013, 4 pages.

Mamdy et al., "A low-noise, P-type, vertically-pinned and back-side-illuminated pixel structure for image sensor applications", STMicroelectronics, Institut des Nanotechnologies de Lyon (INL), boulevard of Nov. 11, 1918—69622 Villeurbanne Cedex—France, 4 pages.

Zhou et al., "A low power global shutter pixel with extended FD voltage swing range for large formathigh speed CMOS image sensor," *Science China Information Sciences* 58:2015, 10 pages.

U.S. Appl. No. 15/882,482, filed Jan. 29, 2018.

* cited by examiner

PIXEL AND METHOD FOR CONTROLLING THE SAME

BACKGROUND

Technical Field

The present disclosure relates generally to electronic circuits, and more specifically to a pixel of an image sensor.

Description of the Related Art

Image sensors comprising pixels are known. The dynamic of a pixel of an image sensor depends on the maximum potential, in absolute value, that can be supplied to the pixel in order to polarize the transistors of the pixel and to control these transistors. More particularly, by increasing the maximum potential supplied to a pixel, it is possible to increase its dynamics, but its consumption is also increased. Thus, depending on the targeted application, a compromise must be found between the maximum dynamic of the pixels of the sensor and the consumption of the pixels of the sensor.

BRIEF SUMMARY

There is a need to address all or some of the drawbacks of the known pixels, in particular it would be desirable to increase the dynamic of a pixel without increasing the maximum potential supplied to the pixel, or to decrease the consumption of a pixel without reducing its dynamic.

One embodiment addresses all or some of the drawbacks of known pixels.

One embodiment provides a pixel comprising: a detection node; a first normally on transistor connected between the detection node and a rail for applying a first potential; and a second transistor whose gate is connected to the detection node.

According to one embodiment, the drain of the second transistor is coupled, preferably connected, to said rail.

According to one embodiment, the pixel further comprises: a photosensitive area, preferably a pinned photodiode; and a charge transfer device connected between said area and the detection node.

According to one embodiment, the device is a transfer gate.

According to one embodiment, the source of the second transistor is coupled to a reading node of the pixel.

According to another embodiment, the pixel further comprises a third transistor connected between the source of the second transistor and the reading node.

Another embodiment provides a method comprising a step for initializing a detection node of a pixel consisting of applying a first potential on the gate of the normally on first transistor of the pixel, the first transistor being connected between a rail at the first potential and the detection node, and the gate of a second transistor of the pixel being connected to the detection node.

According to one embodiment, the drain of the second transistor is coupled, preferably connected, to said rail.

According to one embodiment, the pixel further comprises a photosensitive area, and a charge transfer device, preferably a transfer gate, connected between said area and the detection node.

According to one embodiment, the source of the second transistor is coupled to a reading node of the pixel by a third transistor connected between the source of the second transistor and the reading node.

According to one embodiment, the first transistor is a buried channel transistor preferably comprising a doped region of the same type as its source and its drain, said region extending below the gate, from the source to the drain.

According to one embodiment, the transistors are N-channel MOS transistors.

According to one embodiment, the transistors are P-channel MOS transistors.

Another embodiment provides an image sensor comprising: a plurality of pixels as described; and a first circuit configured to apply, during a step for initializing the detection node, the first potential to the gate of the first transistor.

According to one embodiment, the sensor further comprises a second circuit configured to supply the first potential to said rail and the first circuit.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the steps of known methods for controlling pixels of a sensor, the known reading circuits of the pixels of the sensor, and the applications or electronic devices in which an image sensor can be provided have not been described in detail, the described embodiments being compatible with the steps of these known control methods, these known reading circuits and these known applications or devices.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

Figure 1:
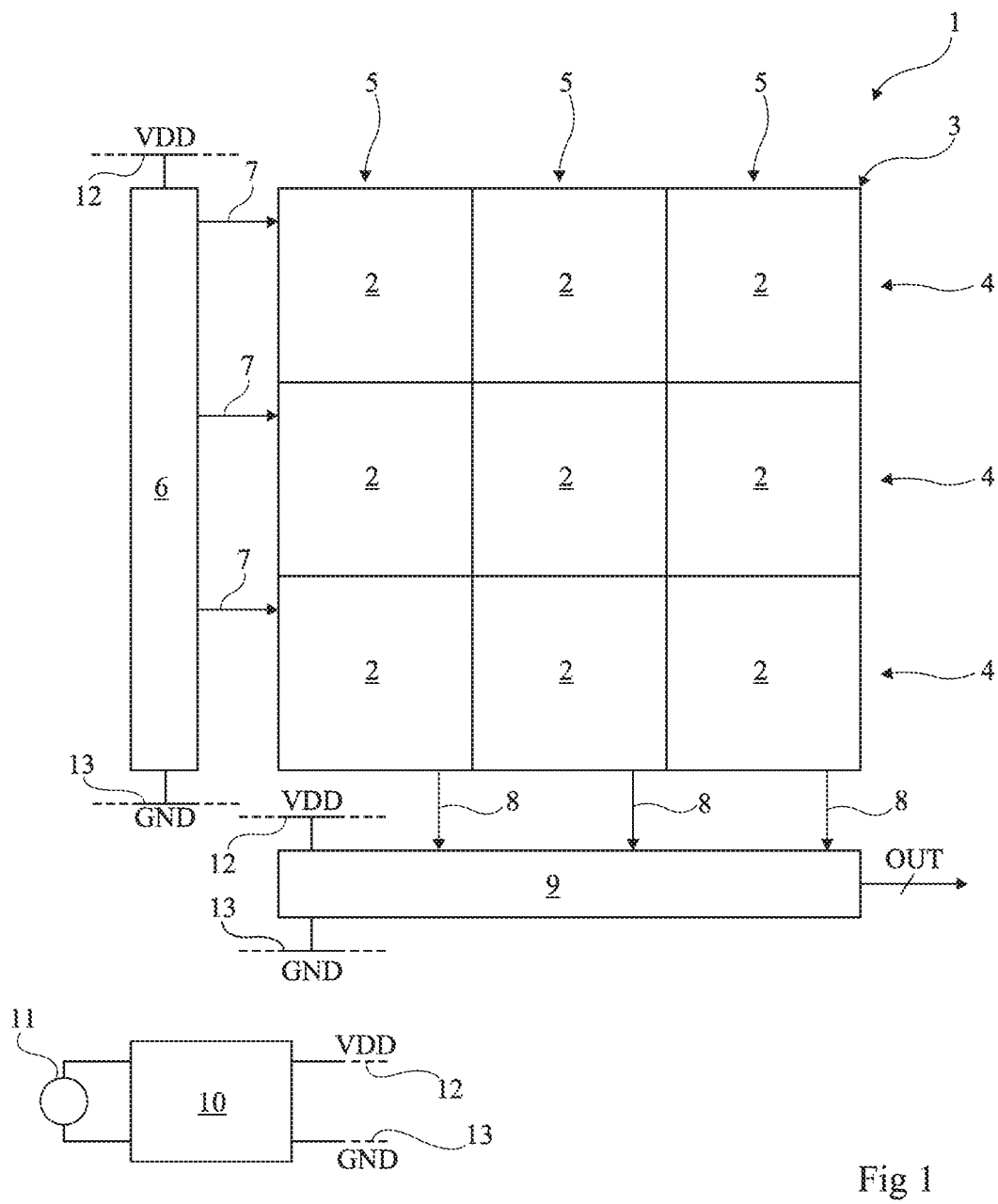
FIG. 1 shows, schematically and in block diagram form, an embodiment of an image sensor.

FIG. 1 schematically shows, in block diagram form, an embodiment of an image sensor 1.

The sensor 1 comprises a plurality of pixels 2, for example organized in a matrix 3 of rows 4 of pixels 2 and columns 5 of pixels 2. In this example, the matrix 3 comprises three rows 4 and three columns 5, therefore nine pixels 2, although in practice, such a matrix can comprise several thousand, or even several million pixels 2.

The sensor 1 comprises a row control circuit 6 configured to control the pixels 2. The circuit 6 is configured to supply control signals 7 of each pixel 2 to the sensor 1. Preferably, as shown schematically, the circuit 6 supplies the same control signals 7 to all of the pixels of a same row 4. In particular, one of the control signals 7 makes it possible to select a given row 4, that is to say, all of the pixels 2 in this row 4, at once. When a pixel 2 is selected, in practice this amounts to coupling it electrically to at least one reading node or rail 8, generally shared by all of the pixels in a same column 5. In this example, each pixel 2 can be coupled to a single corresponding rail 8, shared by all of the pixels 2 in a same column 5.

The sensor 1 also comprises a reading circuit 9 configured to read the pixels 2. The circuit 9 is connected to all of the rails 8 in order to receive, for each column 5, an output signal of the pixel 2 of this column 5 that is selected by the circuit 6. The circuit 9 then supplies a signal OUT, for example a digital signal, representative of the light received by each of the pixels 2 of the selected row 4.

A processing circuit, not shown, is configured to reconstruct an image from the signals OUT that it receives from the circuit 9 when the circuit 6 selects, one after the other, all of the rows 5 of the sensor 1.

The sensor 1 comprises a circuit 10 configured to supply, for example from a power supply source 11 such as a battery, a potential VDD and a reference potential, typically the ground GND. The potentials VDD and GND are in particular supplied to conductive power rails 12 and 13, respectively.

The circuits 6 and 9 are connected to the rails 12 and 13 to be electrically supplied. Furthermore, the circuit 6 uses the potentials VDD and GND in order to supply binary control signals 7, a first binary state of which, for example '1', corresponds to one of the potentials VDD and GND, for example to the potential VDD, and a second binary state of which, for example '0', corresponds to the other of these potentials, for example the ground potential GND.

Although this has not been shown in FIG. 1, each pixel 2 is coupled, preferably connected, to the rails 12 and 13 in order to be supplied, in particular to polarize the transistors of the pixel.

The circuit 10 can supply one or several other potentials (not shown), for example a negative potential, to another conductive rail or node. These other potentials for example correspond to a binary state '0' or '1' of a control signal 7, for example, a signal 7 whose state '1' corresponds to the potential VDD and whose state '0' corresponds to a potential other than the reference potential GND.

It is considered here that all of the potentials supplied by the circuit 10 and received by the pixels 2 are referenced relative to the ground potential GND. It is further considered that the potential VDD, for example positive, is, in absolute value, the highest level of potential supplied to the pixels 2. The potential VDD is then the maximum potential in the sensor 1, and in particular in the pixels 2.

The consumption of the sensor 1 is coupled to the maximum potential VDD, this consumption increasing with the absolute value of the potential VDD.

Figure 2:
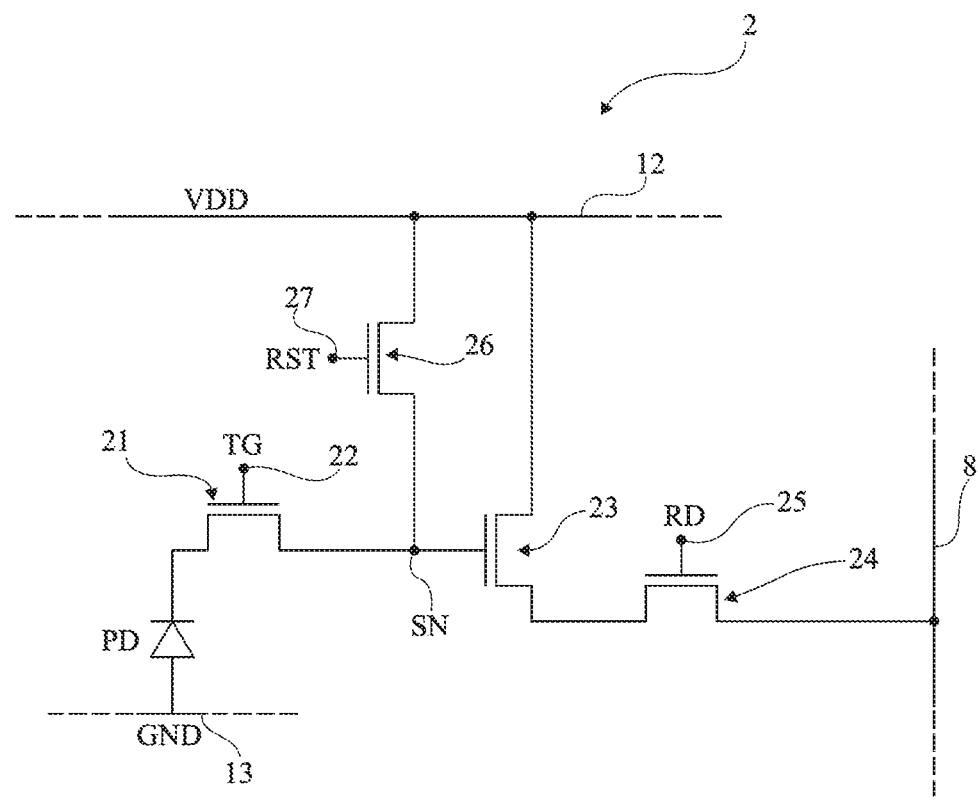
FIG. 2 shows, in the form of a circuit, one embodiment of a pixel.

FIG. 2 shows, schematically and in the form of a circuit, one embodiment of a pixel, for example a pixel 2 of the sensor of FIG. 1. In this example, the pixel 2 is a pixel with four transistors, commonly called 4T pixel.

The pixel 2 comprises a photosensitive element PD. The photosensitive element PD is configured so that charges are generated and accumulated therein when it receives light, that is to say, photons. In this example, the photosensitive element is a pinned photodiode, although the photosensitive element can be different from a pinned photodiode, for example a photogate. The photodiode PD has one of its terminals coupled, preferably connected, to a power rail or node, that is to say, a rail or node for applying a supply potential, and another of its terminals coupled to a detection node SN by a charge transfer device 21. A control terminal of the device 21 is coupled, preferably connected, to a rail or node 22 for applying a control signal TG. The signal TG for example corresponds to one of the signals 7 supplied by the circuit 6 of the sensor 1 (FIG. 1).

In this example where the useful photogenerated charges of the pixel 2 are electrons, the anode of the photodiode PD is coupled, preferably connected, to the rail 13 for applying the reference potential GND, its cathode being coupled to the node SN by a transfer gate 21 connected to the node 22. More particularly, the transfer gate 21 extends between an N-doped region forming all or part of the cathode of the photodiode PD, and an N-doped region corresponding, at least in part, to the node SN.

The pixel 2 comprises a MOS transistor 23, in this example an N-channel MOS transistor, whose gate is coupled, preferably connected, to the node SN. The transistor 23 is commonly said to be connected as a "source follower" transistor. A first conduction terminal of the transistor 23, in this example its drain, is coupled, preferably connected, to a power rail or node, that is to say, a rail or node for applying a supply potential, in this example the rail or node 12 for applying the potential VDD. A second conduction terminal of the transistor 23, in this example its source, is coupled to a reading rail or node of the pixel 2, in this example a reading rail 8 (FIG. 1).

More particularly, the transistor 23 is coupled to the rail 8 by means of a MOS transistor 24, in this example N-channel. The conduction terminals of the transistor 24 are respectively coupled, preferably connected, to the transistor 23, here to the source of the transistor 23, and to the reading rail 8. The gate, or control terminal, of the transistor 24 is coupled, preferably connected, to a rail or node 25 for applying a control signal RD. The signal RD for example corresponds to one of the signals 7 supplied by the circuit 6 of the sensor 1 (FIG. 1), and more particularly to the signal making it possible to select all of the pixels 2 of a same row 4.

The pixel 2 comprises a MOS transistor 26, in this example N-channel. The conduction terminals of the transistor 26 are coupled, preferably connected, respectively to the rail 12 and to the SN node. The gate of the transistor 26 is coupled, preferably connected, to a rail or node 27 for applying a control signal RST. For example, the signal RST corresponds to one of the signals 7 supplied by the circuit 6 of the sensor 1 (FIG. 1).

In this embodiment, unlike the known 4T pixels, the transistor 26 is configured to be normally on. In other words, this means that, for a zero volt potential applied on its source, on its gate, and in the case of a transistor on bulk substrate, on its body, the transistor 26 is on. Said in still another way, for an N-channel MOS transistor, this means that its threshold voltage is negative, and for a P-channel MOS transistor, this means that its threshold voltage is positive.

An example transistor configured to be normally on is a transistor in which, below the gate of the transistor, the channel formation area or region extending from the source to the drain of the transistor comprises a doped region of the same conductivity type as the source and the drain, this region extending from the source to the drain of the transistor. The channel formation area can even be completely doped with the same type of conductivity as the drain and source regions that it separates from one another. Such a transistor is commonly called buried channel transistor, due to the fact that, in the on state of the transistor, between the source and the drain of the transistor, the charges circulate at a depth, and not just below the surface of the gate insulator. Such a transistor is also called depletion mode transistor. This type of transistor can be made in and/or on a massive semiconductor substrate. This type of transistor can also be made in and/or on a semiconductor layer of a structure of the SOI (Semiconductor On Insulator) type.

An example transistor configured to be normally on is a transistor made in and/or on a semiconductor layer of the SOI type, in particular a thin semiconductor layer whereof the small thickness, for example less than 20 nm, causes the transistor to be fully depleted (FDSOI—Fully Depleted SOI), a polarization potential, for example supplied by the circuit 10 (FIG. 1) being applied to the rear gate of the transistor, that is to say to the region or to the material arranged in contact with the insulating layer of the SOI structure, on the side opposite the channel formation region, so that the transistor is normally on.

The operation of the pixel 2 is as follows.

During an initialization phase of the node SN, the transistor 26 is switched to the on state. Thus, the potential VDD of the rail 12, here corresponding to the drain potential of the transistor 26, for example 3.5 V, is found on the source of the transistor 26, therefore on the node SN.

In order for the transistor 26, the threshold voltage of which is negative in this example, to switch to the on state, the signal RST is switched to a potential such that the gate-source voltage, Vgs, of the transistor 26 is higher than its threshold voltage. This potential is for example supplied by the circuit 10 to the circuit 6 (FIG. 1). Preferably, the signal RST is switched to the potential VDD, which amounts to having a nil voltage VGS and gate-drain voltage Vgd.

More generally, during the initialization phase of the node SN, the signal RST is kept at a potential of opposite sign from that of the threshold voltage of the transistor 26, or preferably, at a potential identical to the potential on the drain of the transistor 26, the voltage Vgd then being nil.

Preferably, during the initialization phase, the transistor 21 is kept in the off state. Thus, the node SN is electrically isolated from the photodiode PD. The manner in which the photosensitive element PD can be initialized, that is to say, the method of emptying the element PD of all of the photogenerated charges that may be located therein, is within the reach of those skilled in the art and will not be described in detail here.

At the end of the initialization phase of the node SN, the transistor 26 is switched to the off state. In order for the transistor 26, the threshold voltage of which is negative in this example, to be switched to the off state, the signal RST is switched to a low potential such that the voltage Vgs of the transistor 26 is below its threshold voltage. This potential is for example supplied by the circuit 10 to the circuit 6, such that the circuit 6 generates the signal RST. Preferably, this potential is, in absolute value, below the potential VDD, for example equal to 0 V.

Furthermore, this potential is such that the transistor 26 remains off until charges accumulated in the element PD will be transferred to the node SN. In this example, this charge transfer can cause the potential of the node SN to decrease as much as possible to the depletion potential of the photodiode PD, for example 1.5 V. It then suffices for the low potential of the signal RST to be such that the depletion potential of the channel of the transistor 26, that is to say, the potential in the channel formation region of the transistor 26, to be below the depletion potential of the photodiode PD, therefore the minimum potential of the node SN, when the low potential of the signal RST is applied to the gate of the transistor 26.

During a reading phase, the transistor 24 is switched to the on state, for example by switching the signal RD of the potential GND (transistor 24 off) to the potential VDD. This amounts to selecting the pixel 2. A first potential representative of the initial potential, or initialization potential, of the node SN is then found on the reading rail 8.

The device 21 is next turned on and the photogenerated charges that have accumulated in the element PD since the beginning of the integration phase are transferred to the node SN. The variation of the potential of the node SN resulting therefrom is representative of the light received by the pixel 2 during the integration phase and causes a corresponding variation of the potential of the reading rail 8, which is found at a second potential. The difference between the first and second potentials (CDS—correlated double sampling) is representative of the light received by the pixel 2 during the integration phase.

It will be understood that the dynamic of the pixel 2 is coupled to the maximum amplitude of the variation of the potential of the node SN, therefore to the absolute value of the potential VDD. Indeed, once the quantity of photogenerated charges transferred at the end of an integration period causes a maximum variation of the potential of the node SN relative to its initialization potential VDD, it is no longer possible to distinguish this quantity of photogenerated charges from a greater quantity of photogenerated charges that would be transferred to the node SN, for example after another integration phase, because it would cause the same maximum variation of the potential of the node SN.

In a 4T pixel where the transistor 26 is a transistor that is normally off and in which the signal RST is at the potential VDD during the initialization phase, the initialization potential of the node SN would at most be equal to the potential VDD minus the threshold voltage of the transistor 26. Thus, in a transistor pixel 26 that is normally off, the maximum variation of the potential of the node SN would be smaller than that of the pixel 2, for a given value of the potential VDD. In other words, the maximum quantity of transferred photogenerated charges causing a maximum variation of the potential of the node SN, that is to say, the maximum quantity of photogenerated charges detectable by the pixel, would be smaller than that of the pixel 2, for a given value of the potential VDD. For a given value of the potential VDD, therefore a given consumption, the pixel 2 has a greater dynamic than a similar transistor pixel 26 that is normally off.

In order to obtain the same dynamic in a pixel 2 and in a similar transistor pixel 26 that is normally off, it would be necessary, during the initialization phase, for the RST signal of the transistor pixel 26 that is normally off to be at a potential VDD1 equal to the potential VDD plus the threshold voltage of the transistor 26 that is normally off, therefore at a potential VDD1 greater than the potential VDD. This would result, for a same dynamic, in the consumption of the pixel 2 being lower than that of a similar transistor pixel 26 that is normally off. This would further result in making the transistor pixel 26 that is normally off more complex relative to the pixel 2, due to the provision of an additional power rail.

As a result, the potential VDD and/or the high potential of the signal RST (transistor 26 on) are equal to about 3.5 V or about 2.5 V, preferably to 3.5 V or 2.5 V. The low potential of the signal RST (transistor 26 off) is for example equal to 0 V for a threshold voltage of the transistor 26 equal to −1 V.

Described above in reference to FIGS. 1 and 2 is an embodiment of a 4T pixel in which the transistor 26 making it possible to initialize the potential [of] the detection node 26 of the pixel, or initialization transistor 26, is normally on. In embodiment variants that are not illustrated, an initialization transistor that is normally on can be provided in types of pixels other than a 4T pixel, while procuring the same advantages therein in terms of consumption and/or dynamics. For example, it is possible to provide a normally on initialization transistor in a global shutter pixel, that is to say, a pixel of a global shutter image sensor.

Various embodiments and variants have been described. Those skilled in the art will understand that certain features of these embodiments can be combined and other variants will readily occur to those skilled in the art. In particular, those skilled in the art are able to adapt the embodiments are variants described above to the case of pixels made with P-channel transistors and/or to the case of pixels made with transistors of a sector or a technology other than the MOS technology or sector.

Finally, the practical implementation of the embodiments and variants described herein is within the capabilities of those skilled in the art based on the functional description provided hereinabove. In particular, the practical production of the normally on transistor 26, in particular the choice of its threshold voltage and high and low potentials of the signal RST, and more generally the practical production of pixels comprising such a transistor, is within the capabilities of those skilled in the art from the functional description provided above. Furthermore, the generation, for example by the circuit 10, of the high and low potentials of the signal RST making it possible to keep the transistor 26 respectively on and off, is within the capabilities of those skilled in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
   a plurality of pixels, which each pixel includes:
      a detection node;
      a reading node;
      a normally on first transistor coupled between the detection node and a first potential, the first transistor being fully depleted semiconductor on insulator (FDSOI) type, N-channel transistor having a negative threshold voltage;
      a second transistor having a gate coupled to the detection node and a first terminal coupled to the first potential, the second transistor being an N-channel transistor that is a different type than the first transistor;
      a photosensitive element;
      a charge transfer transistor coupled between the photosensitive element and the detection node; and
      a third transistor coupled between a second terminal of the second transistor and the reading node; and
   a controller coupled to the plurality of pixels and configured to:
      couple the gate terminal of the first transistor to the first potential to initialize the detection node;
      turn on the first transistor in response to the initialized detection node;
      nullify a gate-source voltage and a gate-drain voltage of the first transistor; and
      couple the gate terminal of the third transistor to ground, the third transistor configured to be off when the gate terminal of the third transistor is coupled to ground.

2. The system according to claim 1, wherein the charge transfer transistor is a transfer gate.

3. The system according to claim 1, wherein the first transistor is a buried channel transistor that includes a doped channel region, a source, and a drain, said doped channel region extending below the gate, from the source to the drain, wherein the doped channel region, drain, and source have a same conductivity type.

4. The system according to claim 1, wherein the controller is further configured to:
   couple the gate terminal of the first transistor to ground and turn off the first transistor after initializing the detection node; and
   reduce the gate-source voltage of the first transistor to a value less than the negative threshold voltage of the first transistor.

5. The system according to claim 4, wherein the controller is further configured to:
   read an accumulated charge in the photosensitive element by coupling the gate terminal of the charge transfer transistor and the gate terminal of the third transistor to the first potential, the first potential causes to turn on the charge transfer transistor and the third transistor.

6. A method, comprising:
   initializing a detection node of a pixel having a photodiode, the initializing includes:
      activating an on state of a first transistor that is between a first potential and the detection node, the activating includes coupling a gate terminal of the first transistor to the first potential;
      nullifying a gate-source voltage and a gate-drain voltage of the first transistor in response to the first potential; and
      maintaining a second transistor in an off state by coupling a gate terminal of the second transistor to ground, the second transistor is between the photodiode and the detection node; and
   reading out an accumulated charge in the photodiode, the reading out includes:
      coupling the gate of the first transistor to ground, the gate-source voltage of the first transistor being less than a negative threshold voltage of the first transistor in response to ground; and
      transferring the accumulated charge of the photodiode to the detection node by coupling the gate terminal of the second transistor to the first potential.

7. The method according to claim 6, wherein a drain of the second transistor is electrically coupled to the first potential by the first transistor.

8. The method according to claim 6, further comprising a third transistor electrically coupled between a reading node and the detection node.

9. The method according to claim 8, wherein reading out further includes:
coupling a gate terminal of the third transistor to the first potential, the first potential causes to turn on the third transistor.

10. The method according to claim 8, wherein initializing further includes:
coupling a gate terminal of the third transistor to ground, the ground causes to turn off the third transistor.

11. The method according to claim 6, wherein the first transistor is a buried channel transistor that includes a doped channel region, a source, and a drain, said doped channel region extending below the gate, from the source to the drain, wherein the doped channel region, drain, and source have a same conductivity type.

12. The method according to claim 6, wherein the first and second transistors are N-channel MOS transistors.

13. The method according to claim 6, wherein the first transistor is fully depleted semiconductor on insulator (FD-SOI) type.

14. An image sensor comprising:
a plurality of pixels, which each pixel includes:
a detection node;
a photosensitive element coupled between the detection node and ground;
a normally on first transistor coupled between the detection node and a first potential, the first transistor having a gate, the first transistor being a fully depleted silicon on insulator type; and
a second transistor having a gate coupled to the detection node;
a third transistor coupled between the detection node and the photosensitive element, the third transistor having a gate; and
a control circuit configured to:
apply, during a phase of initializing the detection node, the first potential to the gate of the first transistor, the first potential nullifies a gate-source voltage and a gate-drain voltage of the first transistor; and
apply, during a phase of reading out an accumulated charge in the photosensitive element, the first potential to the gate of the third transistor and a ground potential to the gate of the first transistor, the ground potential reduces the gate-source voltage of the first transistor to a value less than a negative threshold voltage of the first transistor.

15. The image sensor according to claim 14, further comprising a supply circuit configured to supply the first potential to the control circuit.

16. The image sensor according to claim 14, wherein the first transistor is a buried channel transistor that includes a doped channel region, a source, and a drain, said doped channel region extending below the gate, from the source to the drain, wherein the doped channel region, drain, and source have a same conductivity type.

17. The image sensor according to claim 14, wherein the control circuit further is configured to:
apply, during the phase of initializing the detection node, the ground potential to the gate of the third transistor, the ground potential turns off the third transistor; and
apply, during the phase of reading out the accumulated charge in the photosensitive element, the first potential to the gate of the third transistor, the first potential turns on the third transistor.

* * * * *